(12) United States Patent
Collados Asensio et al.

(10) Patent No.: US 9,042,848 B2
(45) Date of Patent: May 26, 2015

(54) METHOD AND APPARATUS FOR CALIBRATING AN ENVELOPE TRACKING SYSTEM

(71) Applicant: MediaTek Singapore Pte. Ltd., Singapore (SG)

(72) Inventors: Manel Collados Asensio, Aylesford (GB); Hsin-Hung Chen, Hsinchu County (TW); Jonathan Richard Strange, Reigate (GB)

(73) Assignee: MediaTek Singapore Pte. Ltd., Singapore (SG)

( * ) Notice: Subject to any disclaimer, the term of this patent is extended or adjusted under 35 U.S.C. 154(b) by 11 days.

(21) Appl. No.: 14/040,751

(22) Filed: Sep. 30, 2013

(65) Prior Publication Data

US 2014/0169427 A1    Jun. 19, 2014

Related U.S. Application Data

(60) Provisional application No. 61/739,195, filed on Dec. 19, 2012.

(51) Int. Cl.
*H04B 1/04* (2006.01)
*H03C 1/62* (2006.01)
*H03F 1/02* (2006.01)

(52) U.S. Cl.
CPC . *H03F 1/02* (2013.01); *H04B 17/13* (2015.01)

(58) Field of Classification Search
USPC .......... 455/67.11, 67.14, 114.1, 114.2, 114.3, 455/115.1, 115.2, 127.1, 572, 574; 375/296, 297, 300
See application file for complete search history.

(56) References Cited

U.S. PATENT DOCUMENTS

| | | | |
|---|---|---|---|
| 6,157,253 A | 12/2000 | Sigmon | |
| 7,522,676 B2 * | 4/2009 | Matero | 375/295 |
| 7,884,681 B1 | 2/2011 | Khlat | |
| 8,093,945 B2 | 1/2012 | Wimpenny | |
| 8,194,785 B2 * | 6/2012 | Zolfaghari et al. | 375/297 |
| 8,478,213 B2 * | 7/2013 | Muhammad | 455/127.1 |
| 2012/0249238 A1 * | 10/2012 | Bartram | 330/127 |
| 2012/0306572 A1 * | 12/2012 | Hietala et al. | 330/131 |

* cited by examiner

*Primary Examiner* — Quochien B Vuong
(74) *Attorney, Agent, or Firm* — Winston Hsu; Scott Margo

(57) ABSTRACT

A method of calibrating an envelope tracking system for a supply voltage for a power amplifier module within a radio frequency (RF) transmitter module. The method includes deriving a mapping function between an instantaneous envelope of a waveform signal to be amplified by the power amplifier module and the power amplifier module supply voltage to achieve a constant power amplifier module gain based on a gain compression factor, setting an envelope tracking path of the transmitter module into an envelope tracking mode in which mapping between the instantaneous envelope of the waveform signal and the power amplifier module supply voltage is performed using the derived mapping function, applying a training signal comprising an envelope that varies with time to the RF transmitter module, measuring a battery current, modifying the gain compression factor based on the measured battery current, and re-deriving the mapping function based on the modified gain compression factor.

19 Claims, 6 Drawing Sheets

METHOD AND APPARATUS FOR CALIBRATING AN ENVELOPE TRACKING SYSTEM

CROSS REFERENCE TO RELATED APPLICATIONS

This application claims the benefit of U.S. provisional application No. 61/739,195, filed on Dec. 19, 2012 and incorporated herein by reference.

BACKGROUND

The field of this invention relates to a method and apparatus for calibrating an envelope tracking system, and in particular to a method and apparatus for calibrating an envelope tracking system for a supply voltage for a power amplifier module within a radio frequency (RF) transmitter module of a wireless communication unit.

A primary focus and application of the present invention is the field of radio frequency (RF) power amplifiers capable of use in wireless telecommunication applications. Continuing pressure on the limited spectrum available for radio communication systems is forcing the development of spectrally-efficient linear modulation schemes. Since the envelopes of a number of these linear modulation schemes fluctuate, these result in the average power delivered to the antenna being significantly lower than the maximum power, leading to poor efficiency of the power amplifier. Specifically, in this field, there has been a significant amount of research effort in developing high efficiency topologies capable of providing high performances in the 'back-off' (linear) region of the power amplifier.

Linear modulation schemes require linear amplification of the modulated signal in order to minimise undesired out-of-band emissions from spectral re-growth. However, the active devices used within a typical RF amplifying device are inherently non-linear by nature. Only when a small portion of the consumed DC power is transformed into RF power, can the transfer function of the amplifying device be approximated by a straight line, i.e. as in an ideal linear amplifier case. This mode of operation provides a low efficiency of DC to RF power conversion, which is unacceptable for portable (subscriber) wireless communication units. Furthermore, the low efficiency is also recognised as being problematic for the base stations.

Additionally, the emphasis in portable (subscriber) equipment is to increase battery life. To achieve both linearity and efficiency, so called linearization techniques are used to improve the linearity of the more efficient amplifier classes, for example class 'AB', 'B' or 'C' amplifiers. A number and variety of linearization techniques exist, which are often used in designing linear transmitters, such as Cartesian Feedback, Feed-forward, and Adaptive Pre-distortion.

Voltages at the output of the linear, e.g. Class AB, amplifier are typically set by the requirements of the final RF power amplifier (PA) device. Generally, the minimum voltage of the PA is significantly larger than that required by the output devices of the Class AB amplifier. Hence, they are not the most efficient of amplification techniques. The efficiency of the transmitter (primarily the PA) is determined by the voltage across the output devices, as well as any excess voltage across any pull-down device components due to the minimum supply voltage (Vmin) requirement of the PA.

In order to increase the bit rate used in transmit uplink communication channels, larger constellation modulation schemes, with an amplitude modulation (AM) component are being investigated and, indeed, becoming required. These modulation schemes, such as sixteen-bit quadrature amplitude modulation (16-QAM), require linear PAs and are associated with high 'crest' factors (i.e. a degree of fluctuation) of the modulation envelope waveform. This is in contrast to the previously often-used constant envelope modulation schemes and can result in significant reduction in power efficiency and linearity.

To help overcome such efficiency and linearity issues a number of solutions have been proposed. One technique known as envelope tracking relates to modulating the PA supply voltage to match (track) the envelope of the radio frequency waveform being transmitted by the RF PA. With envelope tracking, the instantaneous PA supply voltage (VPA) of the wireless transmitter is caused to approximately track the instantaneous envelope (ENV) of the transmitted RF signal. Thus, since the power dissipation in the PA is proportional to the difference between its supply voltage and output voltage, envelope tracking enables an increase in PA efficiency, reduced heat dissipation, improved linearity and increased maximum output power, whilst allowing the PA to produce the intended RF output.

FIG. 1 illustrates a graphical representation 100 of two alternative PA supply voltage techniques; a first technique that provides a fixed supply voltage 105 to a PA, and a second technique whereby the PA supply voltage is modulated to track the RF envelope waveform 115. In the fixed supply case, excess PA supply voltage headroom 110 is used (and thereby potentially wasted), irrespective of the nature of the modulated RF waveform being amplified. However, for example in the PA supply voltage tracking of the RF modulated envelope case 115, excess PA supply voltage headroom can be reduced 120 by modulating the RF PA supply, thereby enabling the PA supply to accurately track the instant RF envelope.

The mapping function between ENV and VPA is critical for optimum performance (efficiency, gain, and adjacent channel power (ACP)). Also critical to system performance is timing alignment between the RF signal and VPA at the PA.

Envelope-tracking can be combined with digital pre-distortion (DPD) on the RF signal to improve ACP robustness. Since the ET system is often a multichip implementation involving function blocks in digital baseband (BB), analogue BB, RF transceiver, power management and PA, consistent ET system performance cannot easily be guaranteed across all devices by hardware. There is therefore a need for some level of transceiver calibration in order to accurately map and centre the ET performance of each device leaving the production line. To make envelope-tracking a cost-effective technology, it is desirable to minimize any extra production calibration time and/or use of external characterisation equipment.

Thus, there is a need for an efficient and cost effective solution to the problem of ET system calibration. In particular, it would therefore be advantageous for an auto-calibration method that utilises ENV to VPA mapping strategies that offer optimum or near optimum current consumption for different RMS output power levels to compensate for part-to-part variation, but which method preferably does not add any extra testing costs of significance. Besides, there is a need to find ENV to VPA mapping strategies that offer very low current consumption.

SUMMARY

Accordingly, the invention seeks to mitigate, alleviate or eliminate one or more of the above mentioned disadvantages singly or in any combination. Aspects of the invention provide a method and apparatus for calibrating an envelope tracking system for a supply voltage for a power amplifier module within a radio frequency, RF, transmitter module of a wireless communication unit.

According to a first aspect of the invention, there is provided a method comprising, within at least one signal processing module of the wireless communication unit: deriving a mapping function between an instantaneous envelope of a waveform signal to be amplified by the power amplifier module and the power amplifier module supply voltage to achieve a constant power amplifier module gain based at least partly on a gain compression factor; setting an envelope tracking path of the transmitter module into an envelope tracking mode in which mapping between an instantaneous envelope of a waveform signal to be amplified by the power amplifier module and the power amplifier module supply voltage is performed using the derived mapping function; applying a training signal comprising an envelope that varies with time to an input of the RF transmitter module; measuring a battery current for the wireless communication unit; modifying the gain compression factor based at least partly on the measured battery current for the wireless communication unit; and re-deriving a mapping function between an instantaneous envelope of a waveform signal to be amplified by the power amplifier module and the power amplifier module supply voltage to achieve a constant power amplifier module gain based at least partly on the modified gain compression factor.

In this manner, by modifying the gain compression factor based at least partly on the measured battery current for the wireless communication unit, a mapping function may be derived that provides a more efficient mapping between an instantaneous envelope of a waveform signal to be amplified by the power amplifier module and the power amplifier module supply voltage.

According to a second aspect of the present invention there is provided a non-transitory computer program product comprising executable program code for calibrating an envelope tracking system for a supply voltage for a power amplifier module within a radio frequency, RF, transmitter module of a wireless communication unit, the executable program code operable for, when executed at a communication unit, performing the method of the first aspect of the present invention.

According to a third aspect of the present invention there is provided a communication unit comprising a radio frequency, RF, transmitter module comprising an envelope tracking system for a supply voltage for a power amplifier module within the RF transmitter module, and at least one signal processing module for calibrating envelope tracking system. The at least one signal processing module is arranged to: derive a mapping function between an instantaneous envelope of a waveform signal to be amplified by the power amplifier module and the power amplifier module supply voltage to achieve a constant power amplifier module gain based at least partly on a gain compression factor; set an envelope tracking path of the transmitter module into an envelope tracking mode in which mapping between an instantaneous envelope of a waveform signal to be amplified by the power amplifier module and the power amplifier module supply voltage is performed using the derived mapping function; apply a training signal comprising an envelope that varies with time to an input of the RF transmitter module; measure a battery current for the wireless communication unit; modify the gain compression factor based at least partly on the measured battery current for the wireless communication unit; and re-derive a mapping function between an instantaneous envelope of a waveform signal to be amplified by the power amplifier module and the power amplifier module supply voltage to achieve a constant power amplifier module gain based at least partly on the modified gain compression factor.

According to a fourth aspect of the present invention there is provided an integrated circuit for a communication unit comprising a radio frequency, RF, transmitter module comprising an envelope tracking system for a supply voltage for a power amplifier module within the RF transmitter module, and at least one signal processing module for calibrating envelope tracking system. The at least one signal processing module is arranged to: derive a mapping function between an instantaneous envelope of a waveform signal to be amplified by the power amplifier module and the power amplifier module supply voltage to achieve a constant power amplifier module gain based at least partly on a gain compression factor; set an envelope tracking path of the transmitter module into an envelope tracking mode in which mapping between an instantaneous envelope of a waveform signal to be amplified by the power amplifier module and the power amplifier module supply voltage is performed using the derived mapping function; apply a training signal comprising an envelope that varies with time to an input of the RF transmitter module; measure a battery current for the wireless communication unit modify the gain compression factor based at least partly on the measured battery current for the wireless communication unit; and re-derive a mapping function between an instantaneous envelope of a waveform signal to be amplified by the power amplifier module and the power amplifier module supply voltage to achieve a constant power amplifier module gain based at least partly on the modified gain compression factor.

According to a fifth aspect of the present invention, there is provided a method of modulating a supply voltage for a power amplifier module within a radio frequency, RF, transmitter module of a wireless communication unit. The method comprises, within at least one signal processing module of the wireless communication unit: receiving modulated user data to be transmitted by the transmitter module of the wireless communication unit; determining an envelope of the received modulated user data; determining an instantaneous voltage supply signal based on the envelope of the received modulated user data and a mapping function between an instantaneous envelope of a waveform signal to be amplified by the power amplifier module and the power amplifier module supply voltage derived in accordance with the method of the first aspect of the present invention; and applying the instantaneous voltage supply signal to a voltage supply modulator for the power amplifier module.

According to a sixth aspect of the present invention, there is provided a non-transitory computer program product comprising executable program code for modulating a supply voltage for a power amplifier module within a radio frequency, RF, transmitter module of a wireless communication unit, the executable program code operable for, when executed at a communication unit, performing the method of the fifth aspect of the present invention.

According to a seventh aspect of the present invention, there is provided a communication unit comprising: a radio frequency, RF, transmitter module comprising an envelope tracking system for a supply voltage for a power amplifier module within the RF transmitter module; and at least one signal processing module for calibrating envelope tracking system. The at least one signal processing module is arranged to: receive modulated user data to be transmitted by the transmitter module of the wireless communication unit; determine an envelope of the received modulated user data; determine an instantaneous voltage supply signal based on the envelope of the received modulated user data and a mapping function between an instantaneous envelope of a waveform signal to be amplified by the power amplifier module and the power amplifier module supply voltage derived in accordance with the method of the first aspect of the present invention; and apply the instantaneous voltage supply signal to a supply voltage modulator for the power amplifier module.

According to an eighth aspect of the present invention, there is provided an integrated circuit for a communication unit comprising a radio frequency, RF, transmitter module comprising an envelope tracking system for a supply voltage for a power amplifier module within the RF transmitter module. The integrated circuit comprises at least one signal processing module for calibrating the envelope tracking system and arranged to: receive modulated user data to be transmitted by the transmitter module of the wireless communication unit; determine an envelope of the received modulated user data; determine an instantaneous voltage supply signal based on the envelope of the received modulated user data and a mapping function between an instantaneous envelope of a waveform signal to be amplified by the power amplifier module and the power amplifier module supply voltage derived in accordance with the method of the first aspect of the present invention; and apply the instantaneous voltage supply signal to a supply voltage modulator for the power amplifier module.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Examples of the invention will be described in terms of one or more integrated circuits for use in a wireless communication unit, such as user equipment in third generation partnership project (3GPP™) parlance. However, it will be appreciated by a skilled artisan that the inventive concept herein described may be embodied in any type of integrated circuit, wireless communication unit or wireless transmitter that comprises or forms a part of an envelope tracking system. Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Figure 1:
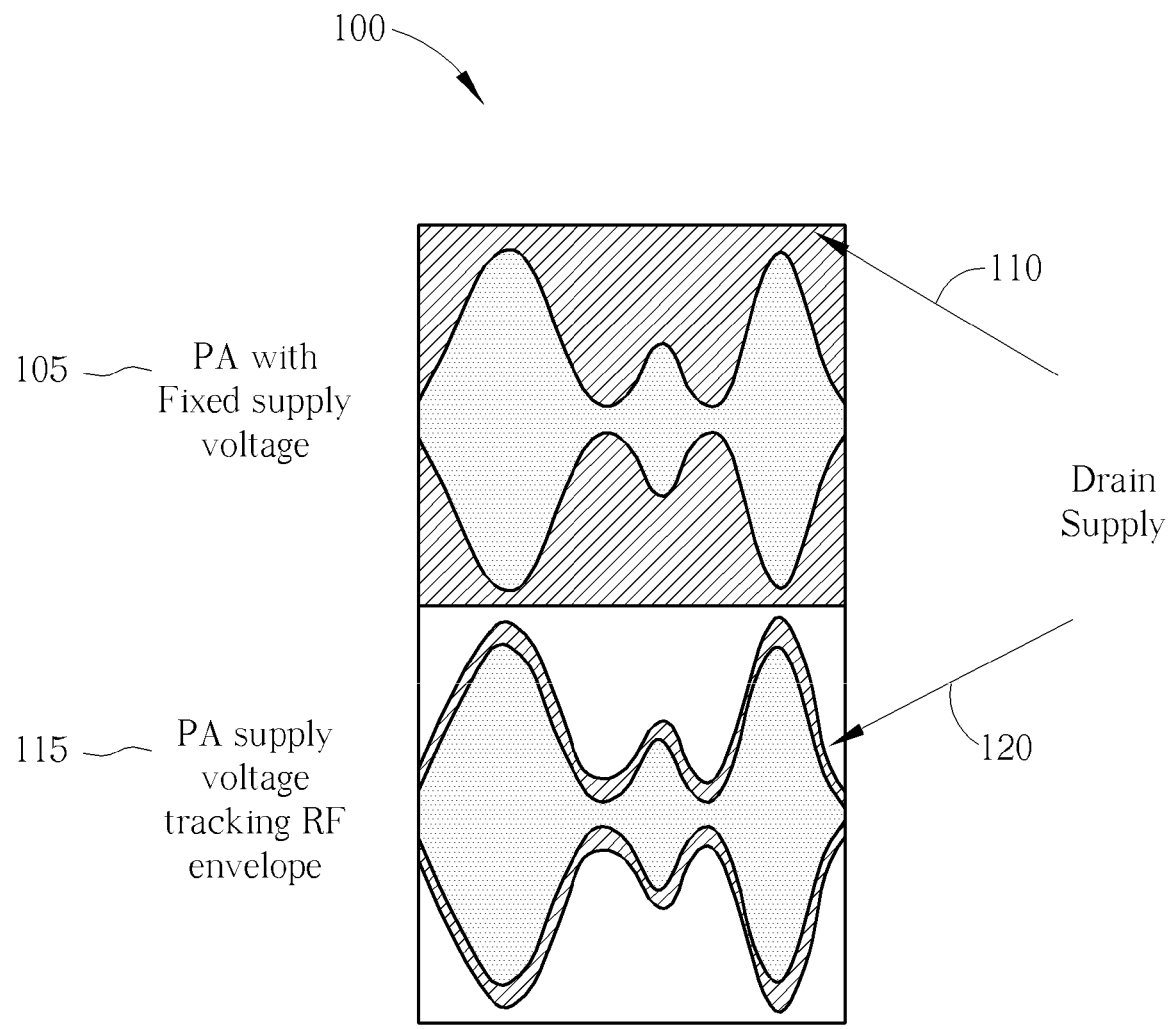
FIG. 1 illustrates a graphical representation of two alternative PA supply voltage techniques.
Figure 2:
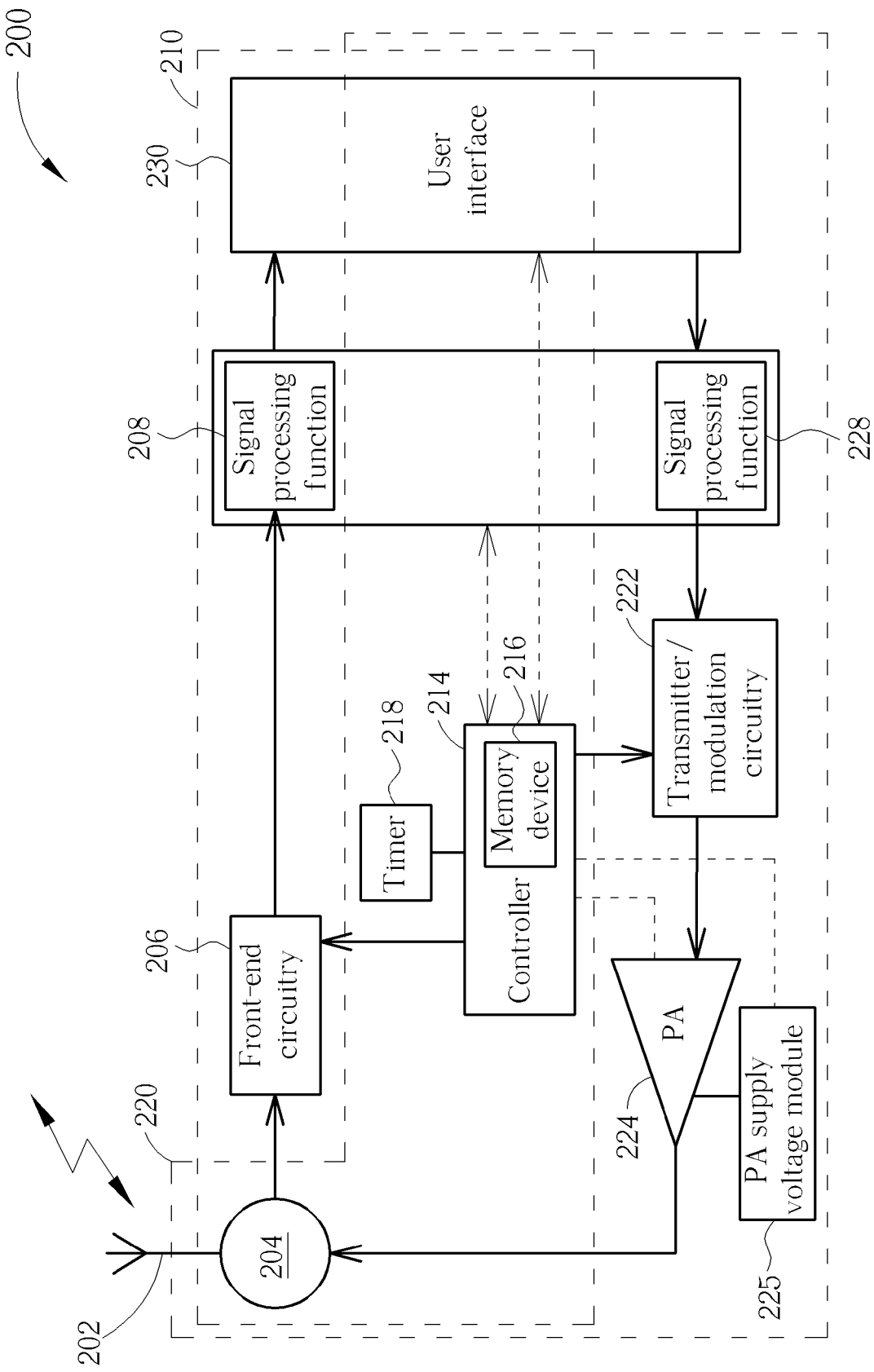
FIG. 2 illustrates a simplified block diagram of an example of a wireless communication unit.

Referring first to FIG. 2, a block diagram of a wireless communication unit (sometimes referred to as a mobile subscriber unit (MS) in the context of cellular communications or a user equipment (UE) in terms of a 3$^{rd}$ generation partnership project (3GPP™) communication system) is shown, in accordance with one example embodiment of the invention. The wireless communication unit 200 contains an antenna (ANT) 202 preferably coupled to a duplex filter or antenna switch 204 that provides isolation between receive and transmit chains within the wireless communication unit 200.

The receiver chain 210, as known in the art, includes receiver front-end circuitry 206 (effectively providing reception, filtering and intermediate or base-band frequency conversion). The front-end circuitry 206 is coupled to a signal processing function 208. An output from the signal processing function 208 is provided to a suitable user interface 230, which may encompass a screen or flat panel display. A controller 214 maintains overall subscriber unit control and is coupled to the receiver front-end circuitry 206 and the signal processing function 208 (generally realised by a digital signal processor (DSP)). The controller 214 is also coupled to a memory device 216 that selectively stores various operating regimes, such as decoding/encoding functions, synchronisation patterns, code sequences, and the like.

In accordance with examples of the invention, the memory device 216 stores modulation data, and power supply data for use in supply voltage control to track the envelope of the radio frequency waveform to be output by the wireless communication unit 200. Furthermore, a timer 218 is operably coupled to the controller 214 to control the timing of operations (transmission or reception of time-dependent signals and in a transmit sense the time domain variation of the PA supply voltage within the wireless communication unit 200).

As regards the transmit chain 220, this essentially includes the user interface 230, which may encompass a keypad or touch screen, coupled in series via signal processing function 228 to transmitter/modulation circuitry 222. The transmitter/modulation circuitry 222 processes input signals for transmission and modulates and up-converts these signals to a radio frequency (RF) signal for amplifying in the power amplifier module or integrated circuit 224. RF signals amplified by the PA module or PA integrated circuit 224 are passed to the antenna 202. The transmitter/modulation circuitry 222, power amplifier 224 and PA supply voltage module 225 are each operationally responsive to the controller 214, with the PA supply voltage module 225 additionally responding to a reproduction of the envelope modulated waveform from the transmitter/modulation circuitry 222.

The signal processing function 228 in the transmit chain 220 may be implemented as distinct from the signal processing function 208 in the receive chain 210. Alternatively, a single processor may be used to implement processing of both transmit and receive signals, as shown in FIG. 2. Clearly, the various components within the wireless communication unit 200 can be realised in discrete or integrated component form, with an ultimate structure therefore being merely an application-specific or design selection.

Furthermore, in accordance with examples of the invention, the transmitter/modulation circuitry 222, together with power amplifier 224, PA supply voltage 225, memory device 216, timer function 218 and controller 214 have been adapted to generate a power supply to be applied to the PA 224. For example, a power supply is generated that is suitable for a wideband linear power amplifier, and configured to track the envelope waveform applied to the PA 224.

Figure 3:
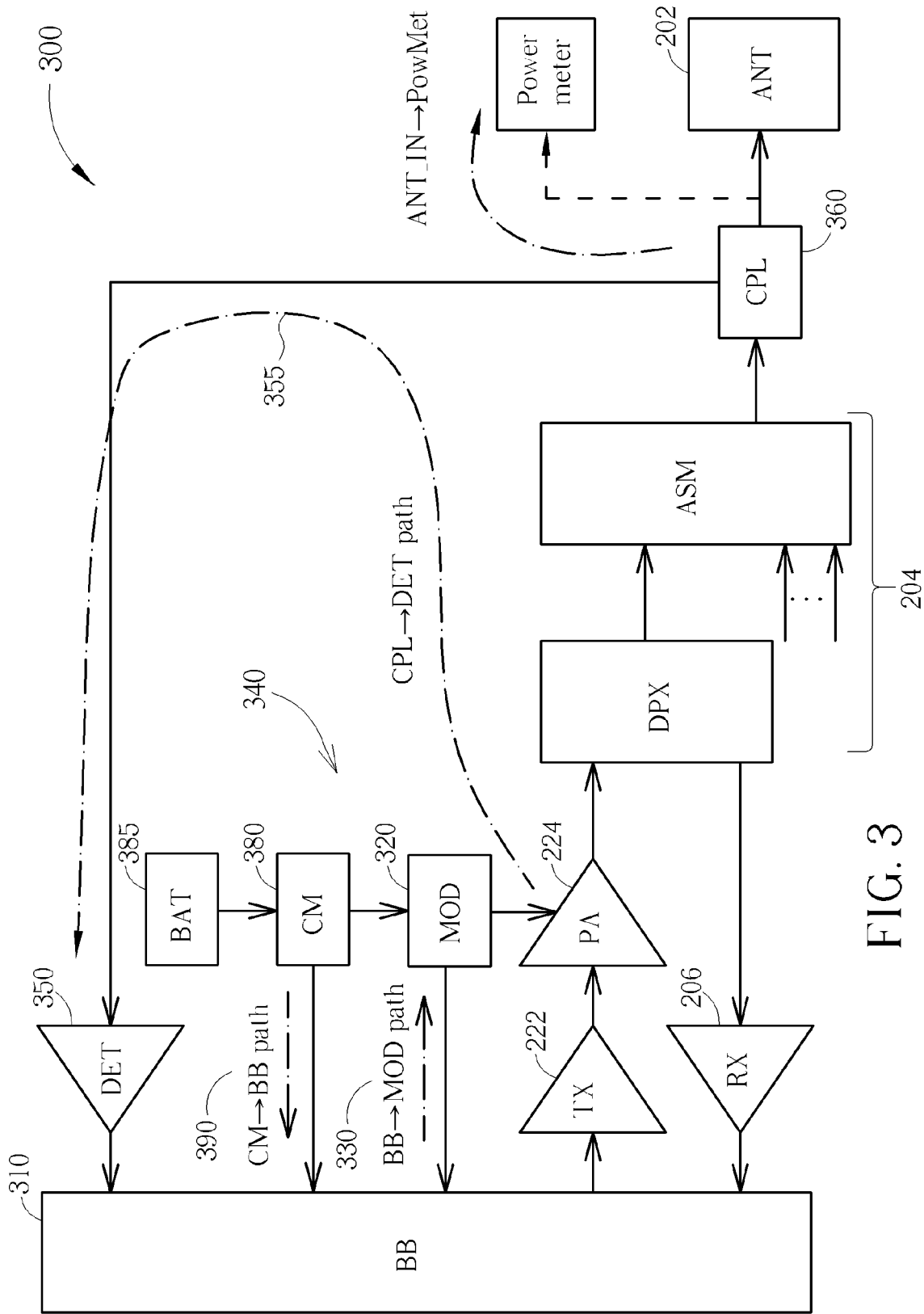
FIG. 3 illustrates a simplified generic block diagram of an example of a part of an RF transceiver architecture.

Referring now to FIG. 3, there is illustrated a generic example block diagram of a part of an RF transceiver architecture 300 of a wireless communication unit, such as the wireless communication unit 200 illustrated in FIG. 2. In the transmit direction, the transceiver architecture 300 comprises transmitter/modulation circuitry (TX) 222 operably coupled between baseband component (BB) 310, for example residing within the signal processing function 228 and/or the controller 214 of FIG. 2, and a PA module 224. The PA module 224 is operably coupled to the antenna 202 via a duplex filter (DPX) and an antenna switch module (ASM), illustrated generally at 204. A PA supply voltage modulator (MOD) 320 is arranged to modulate the supply voltage to the PA module 224 in accordance with an instantaneous voltage supply signal received from the baseband component 310 via a baseband to PA supply voltage modulator (BB to MOD) path 330. The interface used by the BB to MOD path 330 can be analogue or digital, and the control signals may be static or dynamic (i.e. follow the instantaneous envelope of the PA RF signal). In this manner, the PA supply voltage modulator 320, BB to MOD path 330 and corresponding part(s) of the baseband component 310 may be configured to perform envelope tracking modulation of the supply voltage provided to the PA module 224 such that the supply voltage provided to the PA module 224 substantially tracks an envelope of an RF waveform being amplified by the PA module 224. Accordingly, the PA supply voltage modulator 320, BB to MOD path 330 and corresponding part(s) of the baseband component 310 may form (at least a part of) an envelope tracking system 340 of the transceiver architecture 300. In the receive direction, the transceiver architecture 300 comprises receiver front-end circuitry (RX) 206 operably coupled between the duplex filter and a further baseband component 310, for example residing in the signal processing function 208 and/or the controller 214 of FIG. 2.

As previously mentioned, the mapping function between the envelope of the RF waveform being amplified and the modulation of the PA supply voltage is critical for optimum performance (efficiency, gain, and adjacent channel power (ACP)). Also critical to system performance is timing alignment between the RF signal and VPA at the PA. To this end, in the illustrated example, the transceiver architecture 300 illustrated in FIG. 3 further comprises a detection component (DET) 350 arranged to receive an indication of an output of the PA module 224, and to enable the detection of the mapping and alignment of the envelope tracking system, as described in greater detail below.

In the illustrated example, the detection component 350 is illustrated as comprising a discrete component within the transceiver architecture 300, arranged to receive an indication of an output signal of the PA module 224, and to output an indication of a detected output power of the PA module 224 to a baseband component 310, for example residing within the controller 214 of FIG. 2. The detection component 350 may comprise functionality such as amplification, down-mixing, analogue-to-digital conversion, etc. In the illustrated example, the detection component 350 is operably coupled to an antenna coupler (CPL) 360, and arranged to receive an indication of the output signal of the PA module 224 in the form of the RF signal provided to the antenna 202. Advantageously, by using the RF signal provided to the antenna 202 as the indication of the output signal of the PA module 224 in this manner, variations within the duplex filter and antenna switch module 204 may also be compensated for during any calibration subsequently performed based on the detected output power signal generated by the detection component 350.

It will be apparent that the present invention is not limited to the specific example transceiver architecture 300 illustrated in FIG. 3, and may equally be applied to other transceiver architectures. For example, in some alternative architectures the detection component 350 may be operably coupled directly to the output of the PA module 224 and arranged to receive an indication of the output signal of the PA module 224 substantially directly. In some further alternative architectures the detection component 350 may be at least partially merged within the receiver front-end circuitry 206, and arranged to receive an indication of the output signal of the PA module 224 via the duplex filter. In this manner, the detection component 350 could re-use at least some of the functionality of the receiver front-end circuitry 206 such as ADCs, baseband functionality, etc.

In the illustrated example a current monitor component (CM) 380 is provided between a battery (BAT) 385 of the wireless communication unit 200 and the PA supply voltage modulator 320. The current monitor component 380 is arranged to provide an indication of the current flow from the battery 385 to the PA supply voltage modulator 320 to the baseband component 310 via a current monitor to baseband (CM to BB) path 390.

Figure 4:
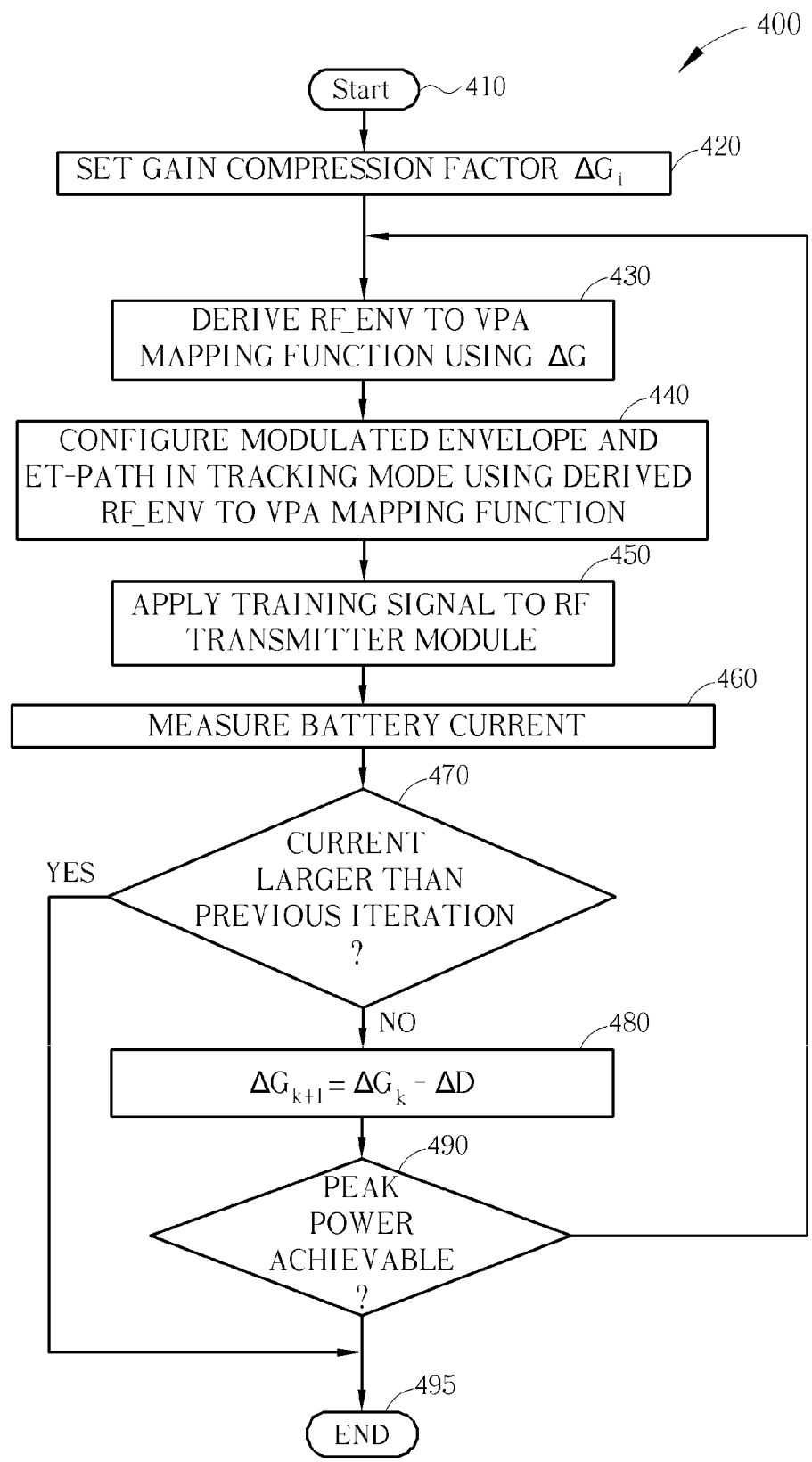
FIGS. 4 and 5 illustrate simplified flowcharts of an example of a method of calibrating at least a part of an envelope tracking system within an RF transceiver.
Figure 5:
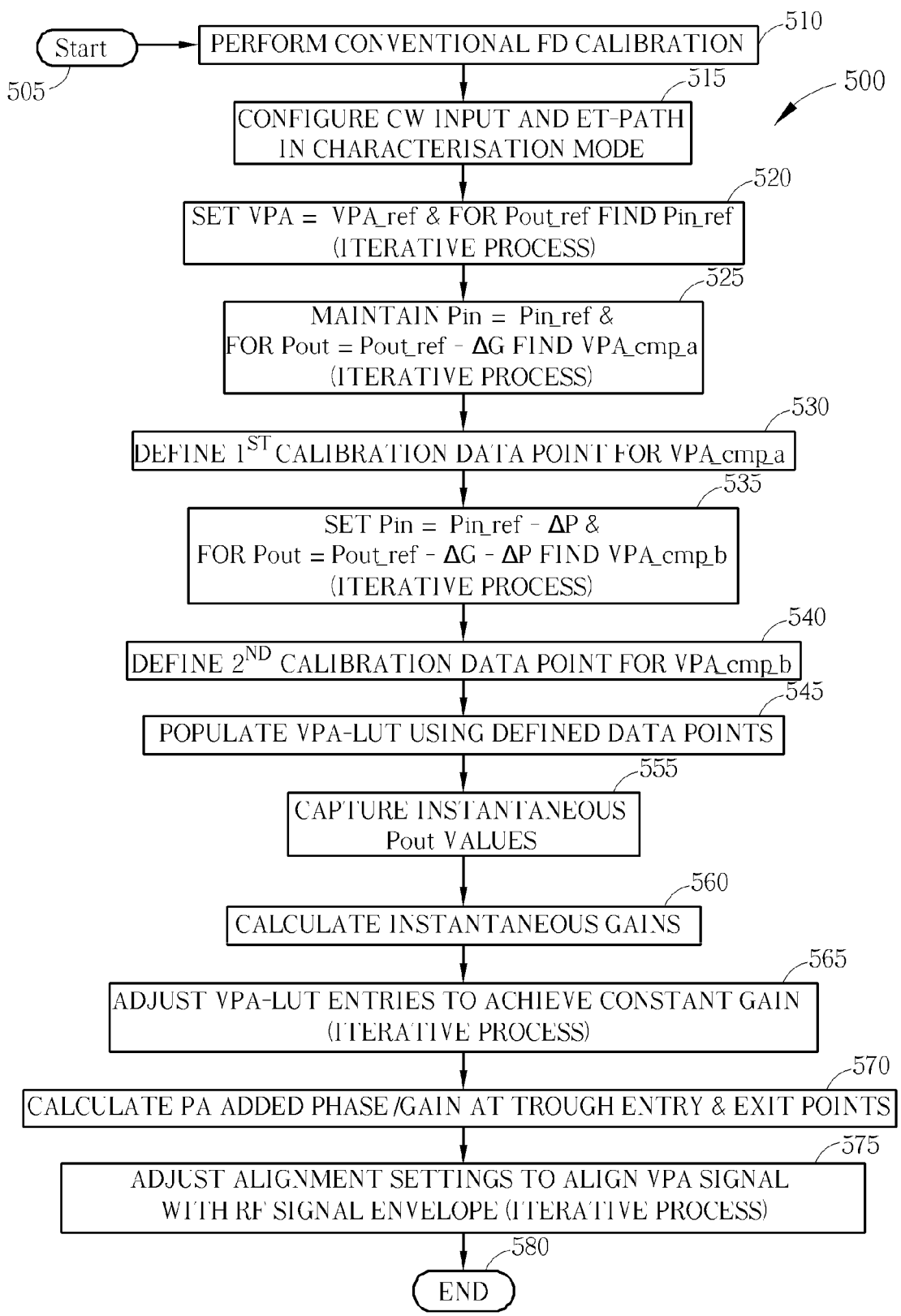

Referring now to FIGS. 4 and 5, there are illustrated simplified flowcharts 400, 500 of an example of a method of calibrating at least a part of an envelope tracking system within an RF transceiver, such as the envelope tracking system 340 of FIG. 3. In the example illustrated in FIG. 3, the method of FIGS. 4 and 5 may be implemented within the baseband component 310.

A problem encountered when calibrating envelope tracking systems is that manufacturing tolerances mean that it is not possible to accurately know the precise gain of a PA module due to per-component variations. As a result, it is difficult to precisely predict the behaviour of individual PA modules at specific input power and PA module supply voltage combinations. However, by calibrating the envelope tracking systems such that the gains of the PA modules are compressed by a certain amount, a consistent behaviour of the individual PA modules may be achieved, irrespective of the per-component variations.

Referring first to FIG. 4, this part of the method starts at 410 and moves on to step 420 where an initial gain compression factor $\Delta G_i$ is set, for example as described in greater detail below. This initial gain compression factor $\Delta G_i$ defines an initial gain compression to be applied to the PA module 224 to achieve the required behaviour of the PA module. The method then moves on to step 430 where a mapping function between an instantaneous envelope of a waveform signal to be amplified by, in the illustrated example, PA module 224 and the PA module supply voltage VPA to achieve a constant PA module gain is derived (for example as described in greater detail below with reference to FIG. 5) based at least partly on the gain compression factor $\Delta G$, which initially comprises the initial gain compression factor $\Delta G_i$ set at step 420.

In the illustrated example of the present invention, having derived the (initial) mapping function between an instantaneous envelope of a waveform signal to be amplified and the PA module supply voltage VPA to achieve a constant power amplifier module gain in step 430, the method moves on to step 440 where an envelope tracking path of the transmitter module, such as provided by the envelope tracking system 340 of the example illustrated in FIG. 3, is set into an envelope tracking mode in which mapping between an instantaneous envelope of a waveform signal to be amplified by the power amplifier module and the power amplifier module supply voltage is performed using the derived mapping function. For example, and as described above in relation to the method of FIG. 5, the baseband component(s) 310 may be configured to produce an envelope modulated waveform signal to be output by the transmit chain of the transceiver, and the envelope tracking path (e.g. provided by the envelope tracking system 340) is configured to operate in a tracking mode whereby the PA supply voltage VPA is configured based on the mapping function derived in step 430.

A training signal comprising an envelope that varies with time is then applied to an input of the RF transmitter module, at step 450. For example, such an envelope modulated waveform signal may be based on any suitable training signal. For example, the training signal may be defined such that it comprises a bandwidth less than the anticipated data bandwidth for the particular transceiver application, and/or such that it comprises a peak to average power ratio equivalent to that of a live uplink modulation for the particular transceiver application. The RMS (root mean square) of the output power may be such that the system is characterised within the wanted window of output powers. An example of a training signal is defined in Equation 1 below:

$$z(t)=0.5(1+\sin(\omega_1 t))\exp^*{j\omega_2 t} \quad [\text{Equation 1}]$$

with a peak to average power ratio of I/Q signals (PAR_IQ)=7 dB, and a peak to average power ratio of RF envelope (PA-PR_RF)=4.3 dB. In addition, any envelope modulation settings required according to the VPA signal characteristics may be configured, for example such as DC (direct current) value, AC (alternating current) swing, etc.

Having applied the training signal to the RF transmitter module in step 450, a battery current is measured to provide an indication of the efficiency of, for example the PA module 224, transmitter/modulation circuitry 222, etc. with the present configuration. For example, referring back to FIG. 3, in the illustrated example a current monitor component 380 is provided between a battery 385 of the wireless communication unit 200 and the PA supply voltage modulator 320. The current monitor component 380 is arranged to provide an indication of the current flow from the battery 385 to the PA supply voltage modulator 320 and/or the transmitter/modulation circuitry 222 to the baseband component 310 via a current monitor to baseband (CM to BB) path 390. In this manner, the baseband component 310 is able to monitor the battery current to the PA module 224 and/or transmitter/modulation circuitry 222 based on the indication received via the CM to BB path 390. In some examples, the CM to BB 390 path may be used to monitor the battery current for each possible battery voltage, PA input power, and PA supply voltage modulator output supply. It will be appreciated that the present invention is not limited to measuring the battery current to only the PA module 224 and/or transmitter/modulation circuitry 222, and it is contemplated that the battery current to any other components within the transceiver architecture 300 and/or the wireless communication unit 200 may additionally/alternatively be measured in order to provide an indication of the efficiency of the transceiver architecture 300 and/or the wireless communication unit 200 under a present configuration.

Significantly, by reducing the PA supply voltage (VPA), the current consumption of the PA module 224 may be reduced, thereby increasing the efficiency of the PA. Accordingly, by monitoring the battery current to the PA module 224, the envelope tracking system 340 may be calibrated to achieve a minimum PA battery current, thereby enabling the efficiency of the PA module 224 to be optimized.

Reducing the PA supply voltage (VPA) results in a drop in the gain of the PA module 224. As such, in order to achieve a required output power for the PA module 224, the input power to the PA module 224 is required to be increased. Such an increase in the input power to the PA module 224 results an increase in the current drawn by the transmitter/modulation circuitry 222. Thus, in order to obtain a minimum combined current for the PA module 224 and the transmitter/modulation circuitry 222, a balance between reducing the PA supply voltage (VPA) to reduce the current consumption of the PA module 224 and a corresponding increase in the input power to the PA module 224 resulting in an increase in the current consumption of the transmitter/modulation circuitry 222 is required to be found. Accordingly, by monitoring the battery current to both the PA module 224 and the transmitter/modulation circuitry 222, the envelope tracking system 340 may be calibrated to achieve a minimum combined current for the PA module 224 and the transmitter/modulation circuitry 222.

Referring back to FIG. 4, the measured battery current is then compared to a measured battery current in a previous iteration, at step 470. If it is determined that the measured battery current in the present iteration is not larger than that of the previous iteration, or if it is the first (initial) iteration, the method moves on to step 480 where the gain compression factor $\Delta G$ is reduced by an incremental amount $\Delta D$. In the illustrated example, a check is then made at step 490 to determine whether a required peak output power for the PA module is achievable with the mapping function derived in the present iteration.

If it is determined that peak power is achievable, the method then loops back to step 430, where a new mapping function is derived based at least partly on the modified (i.e. reduced in the illustrated example) gain compression factor $\Delta G$. However, if it is determined that peak power is not achievable, the mapping function derived within the previous iteration is deemed to provide the most efficient mapping between an instantaneous envelope of a waveform signal to be amplified and the PA module supply voltage VPA, and the method ends at 495

Similarly, referring back to step 470, if it is determined that the measured battery current in the present iteration is larger than that of the previous iteration, the mapping function derived within the previous iteration is deemed to achieve a minimum battery current and thus provide the most efficient mapping between an instantaneous envelope of a waveform signal to be amplified and the PA module supply voltage VPA, and the method ends at 495.

In the example illustrated in FIG. 4, the gain compression factor $\Delta G$ is iteratively modified by being incrementally reduced by an amount $\Delta D$. It will be appreciated that the present invention is not limited to modifying the gain compression factor $\Delta G$ in such a manner, and any other suitable modification may be used. For example, it is contemplated that the initial gain compression factor $\Delta G_i$ may alternatively be set to a small value (potentially zero), and the gain compression factor $\Delta G$ may then be iteratively modified by being incrementally increased by an amount $\Delta D$ until a minimum battery current is achieved. Additionally/alternatively, the present invention is not limited by iteratively modifying the gain compression factor $\Delta G$ by a set amount $\Delta D$. For example, it is contemplated that the amount by which the gain compression factor $\Delta G$ is modified may be adjusted each iteration for example based on a magnitude of the measured battery current, and/or a rate of change of measured battery current between iterations.

The flowchart 500 of FIG. 5 illustrates an example of a method of deriving such a mapping function, such as may be used to implement step 430 in the flowchart of FIG. 4, and which is described in greater detail in the Applicant's copending U.S. application Ser. No. 13/798,099, which is incorporated in its entirety herein by reference. In summary, the example method of FIG. 5 starts at 505, and moves on to step 510 where conventional fixed-drain calibration of a transmit chain of the RF transceiver is performed in order to calibrate the PA and analogue transmit gain steps. Such fixed-drain calibration may comprise, for example, a first step whereby the detection feedback path (CPL to DET path 355 in FIG. 3) is calibrated using at least one measurement obtained by way of an external power meter 370. Once the detection feedback path 355 has been calibrated, and it provides accurate power measurements, a lookup table (LUT) may be created containing, for each desired output power range, corresponding baseband, transmitter/modulation circuitry and PA gain settings. In addition, a lookup table (LUT) within the baseband component 310 corresponding to the envelope tracking system 340 for storing constant PA supply voltage values and their respective PA output power values may be populated using the detection component 350.

Having performed the fixed-drain calibration, the next stage in the method illustrated in FIG. 5 comprises performing an initial (coarse) calibration of the envelope tracking system. This coarse calibration stage begins at step 515 where the baseband component(s) is/are configured to produce a continuous wave to be output by the transmit chain of the transceiver, and the envelope tracking path is configured to operate in a characterisation mode. For example the baseband component(s) may be configured to produce the continuous wave:

$$z(t)=A\cdot\exp(j\omega_0 t) \quad \text{[Equation 2]}$$

If desired, the continuous wave may be duty cycled to reduce the average power and have thermal conditions closer to the conditions in the field. The envelope tracking path may be considered to be in a characterisation mode when the PA supply voltage is not derived from the envelope of the waveform signal to be amplified, but set to a reference voltage (VPA_ref). VPA_ref may be a platform-dependent, predefined voltage chosen based on lab characterization or datasheet data of the particular PA being used in the system. The actual VPA_ref voltage at the PA supply will typically vary from part to part due to component variations within the supply voltage path (e.g. within the PA supply voltage modulator 320, and corresponding part of the baseband component 310 in the example illustrated in FIG. 3.). However, the example calibration method herein described is tolerant of such variations, as will become apparent.

Having configured the baseband component(s) to produce a continuous wave and the envelope tracking path to operate in a characterisation mode (i.e. with the PA supply voltage VPA set to the constant reference voltage (VPA_ref)), the method moves on to step 520, where reference data point values are determined for an upper limit of a linear operating region of the PA module, where the PA module is most efficient. Accordingly, in the illustrated example a reference input power signal (Pin_ref) to the PA module is found that generates a predefined reference output power signal (Pout_ref) when the PA supply voltage is set to the constant reference voltage (VPA_ref). In particular, the reference voltage (VPA_ref) and the predefined reference output power signal (Pout_ref) are chosen such that the PA is biased towards the upper limit of the linear region of operation of the PA module.

In the illustrated example, this is an iterative process where, for the example illustrated in FIG. 3, the output power of the PA module 224 is detected by the detection component 350 and corresponding part of the baseband component 310, and at least an indication thereof may be fed back to the part of the baseband component 310 responsible for outputting the RF waveform to the PA module 224 via the transmitter/modulation circuitry 222. In this manner, the baseband component 310 may iteratively adjust the input power of the RF waveform signal provided to the PA module 224 via the transmitter/modulation circuitry 222, in response to output power indications received from the detection feedback path comprising the detection component 350 and corresponding part of the baseband component 310, until the predefined reference output power signal (Pout_ref) is reached. For example, the input power (Pin) may be iteratively adjusted based on Equation 3 below:

$$Pin(k)=Pin(k-1)+(Pout\_ref-Pout(k-1)) \quad \text{[Equation 3]}$$

where power is expressed in dBm. Alternatively Equation 3 could be expressed in mW, or other units, and the iterative adjustment done accordingly. The predefined values for the constant reference voltage (VPA_ref) and the reference output power signal (Pout_ref) may be chosen in accordance with the particular PA module, duplex filter and antenna switch module used.

In case a duty cycled continuous wave input signal is used (e.g. to reduce the average power and have thermal conditions closer to the conditions in the field), the target output power would comprise Pout_ref*duty_cycle.

As mentioned above, the reference voltage (VPA_ref) and the predefined reference output power signal (Pout_ref) are chosen such that the PA is biased towards the top end of the linear region of operation of the PA module, in order to maximise PA efficiency. However, because of manufacturing tolerances of the various individual components, the actual VPA_ref voltage at the PA supply will typically vary from part to part, and it is difficult to accurately predict where the upper limit of the linear region of operation for each individual PA module will exist. Accordingly, in the illustrated example, having determined the reference data point values for the upper limit of the linear operating region of the PA module, comprising Pin=Pin_ref, Pout=Pout_ref and VPA=VPA_ref, the method moves on to step 525, where the input power for the PA is maintained at Pin_ref, and a PA supply voltage (VPA_cmp_a) is found that produces an output power of the PA module equal to Pout_ref reduced by the predefined gain compression factor ΔG, such that:

$$Pout=Pout\_ref\Delta G \quad \text{[Equation 4]}$$

where power is expressed in dBm and ΔG in dB. Equivalent implementations of Equation 4 are possible in other units like mW or W. As illustrated in FIG. 5, this may also comprise an iterative process. For example, the PA supply voltage VPA may be iteratively adjusted based on Equation 5 below:

$$VPA(k) = VPA(k-1) + (Pout_{tgt} - Pout(k-1)) \cdot \frac{\delta V}{\delta P} \quad \text{[Equation 5]}$$

where Pout_tgt=Pout_ref−ΔG, and $$\frac{\delta V}{\delta P}$$

can be adjusted at each iteration based on the previous iteration.

By reducing the voltage power supply to the PA module in this manner to achieve an output power reduced by the gain compression factor ΔG, the operation of the PA module is allowed to drop down into a compressed gain region by a small amount (dependent on the size of the gain compression factor ΔG). As a result, a consistent and predictable behaviour of the PA module may be achieved, allowing variations in the operating regions of individual PA modules due to manufacturing tolerances to be tolerated.

The initial gain compression factor $\Delta G_i$ may be chosen based on any suitable factors. For example, if GPA_ref−ΔG+Pin_max is less than the maximum required peak output power, where GPA_ref represents the PA module gain when Pin=Pin_ref, Pout=Pout_ref and VPA=VPA_ref, then ΔG may be deemed too large.

Additionally and/or alternatively, if for the minimum input power for which the envelope is not de-troughed (as described below) the gain is smaller than GPA_ref−ΔG, and the PA supply voltage VPA is equal to VPA_max, then ΔG may be deemed too small.

Additionally and/or alternatively, if for the minimum input power for which the envelope is not de-troughed the gain is bigger than GPA_ref−ΔG, and VPA is equal to VPA_min, then ΔG may be deemed too large.

Additionally and/or alternatively, the gain compression factor ΔG could be decided according to the transmitter/modulation circuitry, PA module, duplex filter and antenna switch module (ASM) of the application at hand. This would mean that the part-to-part PA gain variation would not be compensated for. However, this would ensure that all devices operate at the same level of gain compression. This guarantees less part-to-part linearity performance variation and similar performance degradation due to temperature changes. Additionally/alternatively, the gain compression factor ΔG could be adjusted depending on the PA module alone. This would compensate for part-to-part PA gain variation, but then different devices would operate at different levels of compression.

The values VPA=VPA_cmp_a, Pin=Pin_ref and Pout=Pout_ref−ΔG may then be used to define a first calibration data point, as illustrated at step 530.

Having found VPA_cmp_a such that Pout=Pout_ref−ΔG for Pin_ref, and defined the first calibration data point, at least one further calibration data point is required to be derived for the initial (coarse) calibration of the envelope tracking system. Accordingly, at step 535 the input power for the PA module is reduced by a predefined amount ΔP, such that (Pin and Pin_ref in dBm, ΔP in dB):

$$P\text{in}=P\text{in\_ref}-\Delta P \quad \text{[Equation 6]}$$

and a PA supply voltage (VPA_cmp_b) is found that produces an output power of the PA module equal to Pout_ref reduced by the predefined gain compression factor ΔG and the predefined amount ΔP, such that:

$$P\text{out}=P\text{out\_ref}-\Delta G-\Delta P \quad \text{[Equation 7]}$$

As illustrated in FIG. 5, this may comprise an iterative process. For example, the PA supply voltage VPA may be iteratively adjusted based on Equation 5 above, where Pout_tgt=Pout_ref−ΔG−ΔP, and $$\frac{\delta V}{\delta P}$$

can be adjusted at each iteration based on the previous iteration. In this manner, a PA supply voltage (VPA_cmp_b) is found that maintains a constant gain (GPA_ref−ΔG) for the PA module for the reduced output power Pout=Pout_ref−ΔG−ΔP.

The values VPA=VPA_cmp_b, Pin=Pin_ref−ΔP and Pout=Pout_ref−ΔG−ΔP may then be used to define a further (e.g. second) calibration data point, as illustrated at step 540. The initial, coarse calibration of the envelope tracking system may then be performed based at least partly on the derived data points, for example comprising population of an envelope tracking VPA lookup table as illustrated at step 545. Such calibration may comprise, say, linear interpolation of the derived data points to define a linear VPA mapping profile. Alternatively such calibration may comprise using the derived data points to offset and/or scale a pre-characterised VPA mapping profile for a given PA module part number.

As previously mentioned, the mapping function between the instantaneous envelope of the transmitted RF signal and the PA supply voltage is critical for optimum performance (efficiency, gain, and adjacent channel power (ACP)). A linearly interpolated mapping function such as described above for the coarse calibration would assume a gain comprising a straight line passing through the data points for VPA_cmp_a and VPA_cmp_b. However, the actual gain of the PA module is not perfectly linear. The waveform trajectory would not lie exactly on top of a constant gain contour. Accordingly, having performed the coarse calibration of the envelope tracking system, the next stage in the method illustrated in FIG. 5 comprises fine-tuning of the envelope tracking system calibration. This calibration fine-tuning stage begins at step 550 where the baseband component(s) is/are configured to produce an envelope modulated waveform signal to be output by the transmit chain of the transceiver, and the envelope tracking path is configured to operate in a tracking mode whereby the PA supply voltage VPA is configured based on the mapping function between the instantaneous envelope of the envelope modulated waveform signal and the PA supply voltage VPA. In the illustrated example, the mapping function between the instantaneous envelope of the envelope modulated waveform signal and the PA supply voltage VPA is defined within the previously mentioned lookup table populated in step 545 whereby Pin_ref maps to VPA_cmp_a and Pin_ref−ΔP maps to VPA_cmp_b.

The envelope modulated waveform signal may be based on any suitable training signal. For example, the training signal may be defined such that it comprises a bandwidth less than the anticipated data bandwidth for the particular transceiver application, and/or such that it comprises a peak to average power ratio equivalent to that of a live uplink modulation for the particular transceiver application. The RMS (root mean square) of the output power may be such that the system is characterised within the wanted window of output powers. An example of a training signal is defined in Equation 1 above, which is repeated below for convenience:

$$z(t)=0.5(1+\sin(\omega_1 t))\exp(j\omega_2 t) \quad \text{[Equation 1]}$$

for example with a peak to average power ratio of I/Q signals (PAR_IQ)=7 dB, and a peak to average power ratio of RF envelope (PAPR_RF)=4.3 dB.

In addition, any envelope modulation settings required according to the VPA signal characteristics may be configured, for example such as DC (direct current) value, AC (alternating current) swing, etc.

Next, at step 555, instantaneous output values for the PA module are captured, including information such as power and phase of the instantaneous output signal, for example via the detection component 350 in the example illustrate in FIG. 3. Instantaneous gain values are then calculated for the PA module in response to the training signal, at step 560. For example, the captured output signal may be aligned and de-rotated to allow comparison with the input training signal. In the illustrated example, the mapping function between the instantaneous envelope of the modulated waveform signal and the PA supply voltage VPA (e.g. the lookup table populated in step 545 is then adjusted, at 565, in order to achieve a substantially constant gain.

As illustrated in FIG. 5, this may also comprise an iterative process. For example, the PA supply voltage VPA may be iteratively adjusted based on Equation 8 below:

$$VPA(k) = VPA(k-1) + (\text{Gain\_tgt} - \text{Gain}(k-1)) \cdot \frac{\delta V}{\delta G} \quad \text{[Equation 8]}$$

where Gain_tgt is the target constant gain in dB (e.g. GPA_ref–ΔG), and $$\frac{\delta V}{\delta G}$$

can be adjusted at each iteration based on the previous iteration. An equivalent formula to Equation 8 based on power measurements rather than gain measurements can be used instead if deemed more convenient. Also an equivalent formulation of Equation 8 with the gain expressed in the linear domain rather than in dB is possible.

In order to avoid very low PA supply voltage VPA levels, and/or to limit the PA supply voltage VPA AC swing, the PA supply voltage VPA may be de-troughed within the mapping function between the instantaneous envelope of the transmitted RF signal and the PA supply voltage, whereby the PA supply voltage VPA is restricted within the mapping function between the instantaneous envelope of the transmitted RF signal and the PA supply voltage to a minimum value.

As also mentioned above, timing alignment between the instantaneous envelope of the transmitted RF signal and the PA supply voltage modulation is critical to system performance. Initially, the envelope tracking path may be configured to comprise a default timing alignment with respect to the modulated waveform input signal at step 550. If the PA supply voltage VPA and the instantaneous envelope of the transmitted RF signal are perfectly aligned, the instantaneous gain of the PA at the point of entering a trough should be the same as the instantaneous gain of the PA at the point of leaving the trough. However, if the PA supply voltage VPA is lagging with respect to the instantaneous envelope of the transmitted RF signal, the PA supply voltage VPA will be too high at the point of entering the trough, and too low at the point of leaving the trough. As a result, the instantaneous gain of the PA module at the point of entering the trough will be too high, whilst the instantaneous gain of the PA module at the point of leaving the trough will be too low. Conversely, if the PA supply voltage VPA is leading with respect to the instantaneous envelope of the transmitted RF signal, the PA supply voltage VPA will be too low at the point of entering the trough, and too high at the point of leaving the trough. As a result, the instantaneous gain of the PA module at the point of entering the trough will be too low, whilst the instantaneous gain of the PA module at the point of leaving the trough will be too high.

Based on this gain symmetry, a timing alignment setting between the envelope tracking path of the envelope tracking system and a transmit path of the RF transmitter module may be iteratively updated based on Equation 9 below:

$$Del(k) = Del(k-1) + (\text{GPA\_in} - \text{GPA\_out}) \cdot \frac{\delta D}{\delta G} \quad \text{[Equation 9]}$$

where GPA_in is the instantaneous gain of the PA module at the point of entering the trough, GPA_out is the instantaneous gain of the PA module at the point of leaving the trough, and $$\frac{\delta D}{\delta G}$$

can be adjusted at each iteration based on the previous iteration.

The added phase response for the output PA training signal shows a similar symmetry to the gain of the PA supply voltage VPA. Thus, additionally/alternatively, for example at the same time that the magnitude of the gain is calculated, the added phase of the output PA training signal may also be calculated, and based on this phase symmetry the alignment between the PA supply voltage VPA and the instantaneous envelope of the transmitted RF signal may be iteratively updated based on Equation 10 below:

$$Del(k) = Del(k-1) + (\text{Phase\_in} - \text{Phase\_out}) \cdot \frac{\delta P}{\delta G} \quad \text{[Equation 10]}$$

where Phase_in is the added phase of the output PA training signal at the point of entering the trough, Phase out is the added phase of the output PA training signal at the point of leaving the trough, and $$\frac{\delta P}{\delta G}$$

can be adjusted at each iteration based on the previous iteration.

Accordingly, and referring back to FIG. 5, in the illustrated example, having adjusted the mapping function between the instantaneous envelope of the modulated waveform signal and the PA supply voltage in order to achieve a substantially constant gain, at step 565, the method moves on to step 570 where instantaneous gain values for the power amplifier module and/or the added phase of the output PA training signal at trough entry and exit points are calculated. The alignment of the envelope tracking path of the envelope tracking system within the transmit path is then adjusted based on a symmetry of the calculated instantaneous gain values for the power amplifier module and/or the added phase of the output PA training signal, to align the envelope tracking PA supply voltage VPA to the instantaneous envelope of a waveform signal to be amplified by the PA module.

As a by-product of the envelope to PA supply voltage mapping function and alignment characterisation, the AM2AM (amplitude modulation to amplitude modulation) and AM2PM (amplitude modulation to phase modulation) responses for the transmit chain of the RF transceiver architecture are available. If the perfect constant gain VPA mapping has been achieved, the AM2AM response will be ideal (linear). However, achieving such a constant gain VPA mapping does not guarantee an ideal (constant) AM2PM response. In some example embodiments, it is contemplated that the AM2PM response may be used for digital pre-distortion (DPD) of the RF signal, assuming there is sufficient bandwidth in the forward path. For example, digital pre-distortion may be applied to waveform signals prior to being provided to the input of the PA module, e.g. within the baseband component 310 in the example illustrated in FIG. 3. In some examples, it is contemplated that AM2PM pre-distortion may be applied in this manner, and may be applied to the training signal used during the fine tuning of the mapping function calibration and alignment steps of the method of FIG. 5. For example, a default AM2PM pre-distortion may initially be configured and applied at step 550. The AM2PM pre-distortion may then be refined at each iteration of steps 565 and 575. In this manner, once the constant gain mapping has be achieved, and the optimum timing alignment setting found, both the AM2PM response and the AM2PM response may be substantially ideal. The method of FIG. 5 ends at 580.

As mentioned above, by reducing the voltage power supply to the PA module to achieve an output power reduced from the upper limit of the linear region of operation by the gain compression factor $\Delta G$, the PA module is allowed to drop down into a compressed gain region by a small amount (dependent on the size of the gain compression factor $\Delta G$). As a result, variations in where the upper limit of the linear region for individual PA modules due to manufacturing tolerances may be tolerated, since all PA modules operate with the same gain compression factor. Significantly, under such operating conditions, an efficient gain for the PA module may be achieved.

Figure 6:
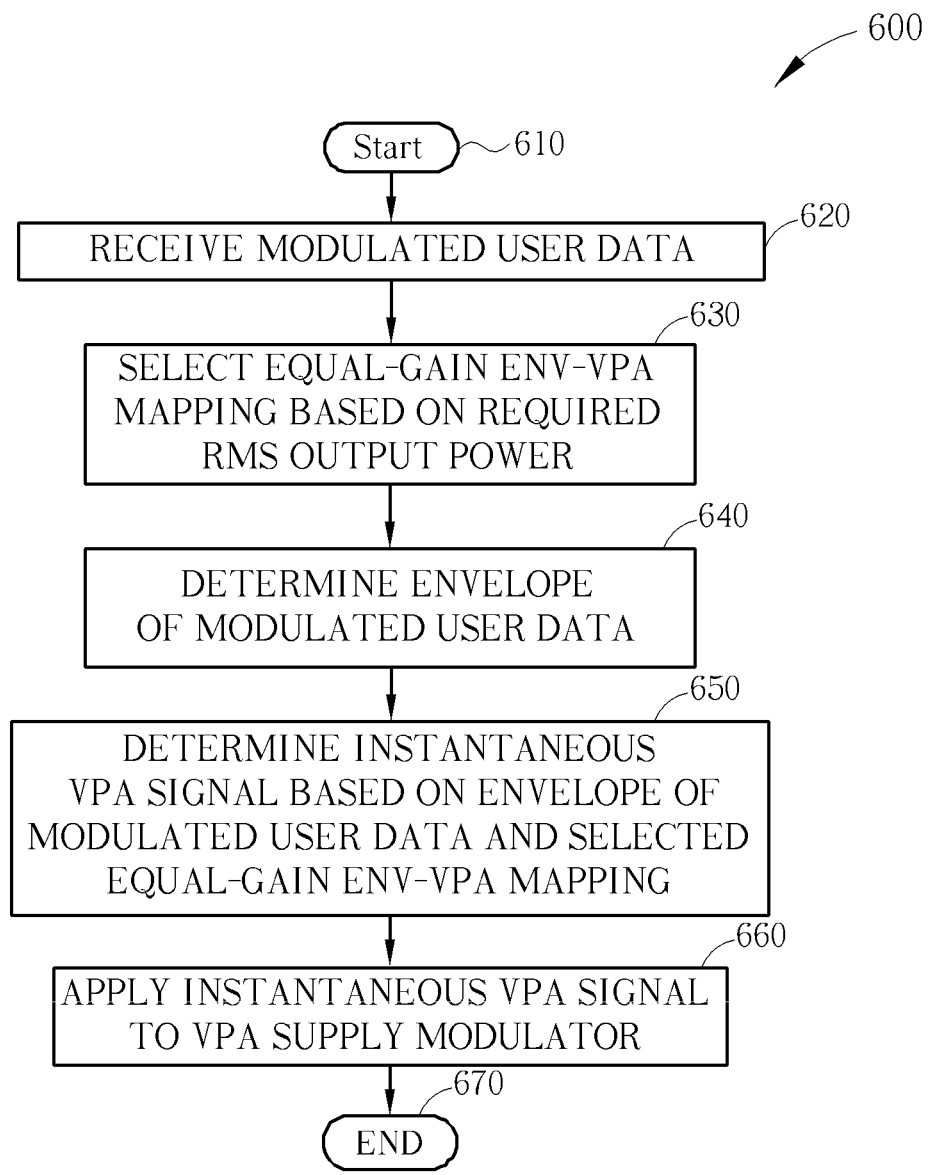
FIG. 6 illustrates a simplified flowchart of an example of a method of modulating a supply voltage for a power amplifier module within a radio frequency, RF, transmitter module of a wireless communication unit.

Referring now to FIG. 6, there is illustrated a simplified flowchart 600 of an example of a method of modulating a supply voltage for a power amplifier module within a radio frequency (RF) transmitter module of a wireless communication unit, such as may be implemented within the transceiver architecture 300 of FIG. 3. The method starts at 610 and moves on to step 620 with the receipt of modulated user data to be transmitted by the transmitter module of the wireless communication unit. Next, at step 630, the method of the illustrated example comprises selecting a minimum current equal-gain mapping (for example derived as hereinbefore described with reference to FIG. 4) based at least partly on a required RMS output power. For example, a plurality of minimum current equal-gain mappings may have previously been derived for a plurality of RMS output power sub-ranges, and step 630 may comprise selecting one of the previously derived minimum current equal-gain mappings corresponding to a required RMS output power sub-range. The method then moves on to step 640 where an envelope of the received modulated user data is determined. Next, at step 650, an instantaneous power amplifier voltage supply signal based on the envelope of the received modulated user data and the selected minimum current equal-gain mapping function is determined. The determined instantaneous power amplifier voltage supply signal is then applied to a supply voltage modulator for the power amplifier at step 660, and the method ends at 670.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the various components/modules, or portions thereof, may implemented as software or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A method of calibrating an envelope tracking system for a supply voltage for a power amplifier module within a radio frequency (RF) transmitter module of a wireless communication unit; the method comprising, within at least one signal processing module of the wireless communication unit:

deriving a mapping function between an instantaneous envelope of a waveform signal to be amplified by the power amplifier module and the power amplifier module supply voltage to achieve a constant power amplifier module gain based at least partly on a gain compression factor;

setting an envelope tracking path of the transmitter module into an envelope tracking mode in which mapping between an instantaneous envelope of a waveform signal to be amplified by the power amplifier module and the power amplifier module supply voltage is performed using the derived mapping function;

applying a training signal comprising an envelope that varies with time to an input of the RF transmitter module;

measuring a battery current for the wireless communication unit;

modifying the gain compression factor based at least partly on the measured battery current for the wireless communication unit; and re-deriving a mapping function between an instantaneous envelope of a waveform signal to be amplified by the power amplifier module and the power amplifier module supply voltage to achieve a constant power amplifier module gain based at least partly on the modified gain compression factor.

2. The method of claim 1, wherein the method comprises iteratively:

deriving a mapping function between an instantaneous envelope of a waveform signal to be amplified by the power amplifier module and the power amplifier module supply voltage to achieve a constant power amplifier module gain based at least partly on the gain compression factor;

setting an envelope tracking path of the transmitter module into an envelope tracking mode in which mapping between an instantaneous envelope of a waveform signal to be amplified by the power amplifier module and the power amplifier module supply voltage is performed using the derived mapping function;

applying a training signal comprising an envelope that varies with time to an input of the RF transmitter module;

measuring a battery current for the wireless communication unit;

modifying the gain compression factor based at least partly on the measured battery current for the wireless communication unit; and re-deriving a mapping function between an instantaneous envelope of a waveform signal to be amplified by the power amplifier module and the power amplifier module supply voltage to achieve a constant power amplifier module gain based at least partly on the modified gain compression factor to achieve a mapping function that achieves a minimum battery current for the wireless communication unit.

3. The method of claim 2, wherein the method comprises:

comparing the measured battery current for a present iteration to the measured battery current for a previous iteration; and modifying the gain compression factor by an incremental amount and re-deriving the mapping function based at least partly on the incrementally modified gain compression factor if the measured battery current for the present iteration is not larger than the measured battery current for the previous iteration.

4. The method of claim 3, wherein the method comprises iteratively modifying the gain compression factor by an incremental amount and re-deriving the mapping function based at least partly on the incrementally modified gain compression factor until an increase in battery current is detected or a required peak output power for the power amplifier module is not achievable.

5. The method of claim 1, wherein the method comprises monitoring a current flow between a battery of the wireless communication unit and at least one of the power amplifier module and transmitter/modulation circuitry of the wireless communication unit, and measuring the battery current for the wireless communication unit based at least partly on the monitoring of said current flow.

6. The method of claim 5, wherein the method comprises monitoring a combined current flow between a battery of the wireless communication unit and the power amplifier module and transmitter/modulation circuitry of the wireless communication unit, and measuring the battery current for the wireless communication unit based at least partly on the monitoring of said current flow.

7. The method of claim 1, wherein the method comprises defining an initial gain compression factor based at least partly on at least one of:

GPA_ref−ΔG+Pin_max≥a maximum required peak output power, where GPA_ref represents a power amplifier module gain when input power (Pin)=Pin_ref, output power (Pout)=Pout_ref and the PA supply voltage (VPA)=VPA_ref;

for a minimum input power for which VPA is not de-troughed and VPA=PA_max, gain≥GPA_ref−ΔG;

for a minimum input power for which VPA is not de-troughed and VPA=VPA_min, gain≤GPA_ref−ΔG; and at least one of the transmitter/modulation circuitry, PA module, duplex filter and antenna switch module of the application at hand.

8. The method of claim 1, wherein deriving a mapping function between an instantaneous envelope of a waveform signal to be amplified by the power amplifier module and the power amplifier module supply voltage to achieve a constant power amplifier module gain comprises:

setting a reference power amplifier module supply voltage;

finding a reference input power for the power amplifier module that produces an output power for the power amplifier module equal to a reference output power, wherein the reference power amplifier module supply voltage and the reference output power are chosen such that the power amplifier module is biased towards an upper limit of a linear region of operation; and configuring an input power for at least a first calibration data point equal to the reference input power, and an output power for the at least first calibration data point equal to the reference output power minus the gain compression factor.

9. The method of claim 8, wherein deriving a mapping function between an instantaneous envelope of a waveform signal to be amplified by the power amplifier module and the power amplifier module supply voltage to achieve a constant power amplifier module gain further comprises:

setting the envelope tracking path of the transmitter module into a characterisation mode in which the power amplifier module supply voltage is not dependent on an instantaneous envelope of a received waveform signal;

applying a continuous wave training signal comprising a constant envelope to the input of the RF transmitter module;

deriving the first calibration data point for the power amplifier module for which the power amplifier module comprises a first gain;

deriving at least one further calibration data point for the power amplifier module for which the power amplifier module comprises the first gain; and deriving the mapping function between an instantaneous envelope of a waveform signal to be amplified by the power amplifier module and the power amplifier module supply voltage based at least partly on the first and at least one further calibration data points.

10. The method of claim 9, wherein deriving the at least one further calibration data point comprises:

setting an input power for the power amplifier module to an at least one further second calibration data point input power, the second calibration data point input power being equal to the first calibration data point input power reduced by a predefined amount;

finding a second calibration data point power amplifier module supply voltage that produces an output power for the power amplifier module equal to a second calibration data point output power, the second calibration data point output power being equal to the first calibration data point output power reduced by the predefined amount; and deriving the at least one further calibration data point based at least partly on the second calibration data point input power and the second calibration data point power amplifier module supply voltage.

11. The method of claim 1, wherein the training signal comprising an envelope that varies with time to an input of the RF transmitter module is defined according to at least one of:

a bandwidth of the training signal being less than an anticipated bandwidth for an intended application for the RF transmitter module;

the training signal comprises a peak to average power ratio equivalent to that of a live uplink modulation for an intended application for the RF transmitter module;

a root mean square of an output power of the power amplifier module is such that the system is characterised within a wanted window of output powers for at least one intended application for the RF transmitter module; and the training signal is defined by $z(t)=0.5(1+\sin(\omega_1 t))\exp(j\omega_2 t)$.

12. A non-transitory computer program product comprising executable program code for calibrating an envelope tracking system for a supply voltage for a power amplifier module within a radio frequency (RF) transmitter module of a wireless communication unit, the executable program code operable for, when executed at a communication unit, performing the method of claim 1.

13. A method of modulating a supply voltage for a power amplifier module within a radio frequency (RF) transmitter module of a wireless communication unit; the method comprising, within at least one signal processing module of the wireless communication unit:

receiving modulated user data to be transmitted by the transmitter module of the wireless communication unit;

determining an envelope of the received modulated user data;

determining an instantaneous voltage supply signal based on the envelope of the received modulated user data and a mapping function between an instantaneous envelope of a waveform signal to be amplified by the power amplifier module and the power amplifier module supply voltage derived in accordance with the method of claim 1; and applying the instantaneous voltage supply signal to a voltage supply modulator for the power amplifier module.

14. The method of claim 13, wherein the method comprises selecting a mapping function between an instantaneous envelope of a waveform signal to be amplified by the power amplifier module and the power amplifier module supply voltage based at least partly on a required root mean square (RMS) output power.

15. A non-transitory computer program product comprising executable program code for modulating a supply voltage for a power amplifier module within a radio frequency, RF, transmitter module of a wireless communication unit, the executable program code operable for, when executed at a communication unit, performing the method of claim 14.

16. A communication unit comprising:

a radio frequency (RF) transmitter module comprising an envelope tracking system for a supply voltage for a power amplifier module within the RF transmitter module; and at least one signal processing module for calibrating envelope tracking system and arranged to:

receive modulated user data to be transmitted by the transmitter module of the wireless communication unit;

determine an envelope of the received modulated user data;

determine an instantaneous voltage supply signal based on the envelope of the received modulated user data and a mapping function between an instantaneous envelope of a waveform signal to be amplified by the power amplifier module and the power amplifier module supply voltage derived in accordance with the method of claim 1; and apply the instantaneous voltage supply signal to a supply voltage modulator for the power amplifier module.

17. An integrated circuit for a communication unit comprising a radio frequency (RF) transmitter module comprising an envelope tracking system for a supply voltage for a power amplifier module within the RF transmitter module; wherein the integrated circuit comprises:

at least one signal processing module for calibrating the envelope tracking system and arranged to:

receive modulated user data to be transmitted by the transmitter module of the wireless communication unit;

determine an envelope of the received modulated user data;

determine an instantaneous voltage supply signal based on the envelope of the received modulated user data and a mapping function between an instantaneous envelope of a waveform signal to be amplified by the power amplifier module and the power amplifier module supply voltage derived in accordance with claim 1; and apply the instantaneous voltage supply signal to a supply voltage modulator for the power amplifier module.

18. A communication unit comprising:

a radio frequency (RF) transmitter module comprising an envelope tracking system for a supply voltage for a power amplifier module within the RF transmitter module; and at least one signal processing module for calibrating envelope tracking system and arranged to:

derive a mapping function between an instantaneous envelope of a waveform signal to be amplified by the power amplifier module and the power amplifier module supply voltage to achieve a constant power amplifier module gain based at least partly on a gain compression factor;

set an envelope tracking path of the transmitter module into an envelope tracking mode in which mapping between an instantaneous envelope of a waveform signal to be amplified by the power amplifier module and the power amplifier module supply voltage is performed using the derived mapping function;

apply a training signal comprising an envelope that varies with time to an input of the RF transmitter module;

measure a battery current for the wireless communication unit;

modify the gain compression factor based at least partly on the measured battery current for the wireless communication unit; and re-derive a mapping function between an instantaneous envelope of a waveform signal to be amplified by the power amplifier module and the power amplifier module supply voltage to achieve a constant power amplifier module gain based at least partly on the modified gain compression factor.

19. An integrated circuit for a communication unit comprising a radio frequency (RF) transmitter module comprising an envelope tracking system for a supply voltage for a power amplifier module within the RF transmitter module; wherein the integrated circuit comprises:

at least one signal processing module for calibrating the envelope tracking system and arranged to:

derive a mapping function between an instantaneous envelope of a waveform signal to be amplified by the power amplifier module and the power amplifier module supply voltage to achieve a constant power amplifier module gain based at least partly on a gain compression factor;

set an envelope tracking path of the transmitter module into an envelope tracking mode in which mapping between an instantaneous envelope of a waveform signal to be amplified by the power amplifier module and the power amplifier module supply voltage is performed using the derived mapping function;

apply a training signal comprising an envelope that varies with time to an input of the RF transmitter module;

measure a battery current for the wireless communication unit;

modify the gain compression factor based at least partly on the measured battery current for the wireless communication unit; and re-derive a mapping function between an instantaneous envelope of a waveform signal to be amplified by the power amplifier module and the power amplifier module supply voltage to achieve a constant power amplifier module gain based at least partly on the modified gain compression factor.

* * * * *